United States Patent
Mizuno et al.

[11] Patent Number: 5,828,079
[45] Date of Patent: Oct. 27, 1998

[54] FIELD-EFFECT TYPE SUPERCONDUCTING DEVICE INCLUDING BI-BASE OXIDE COMPOUND CONTAINING COPPER

[75] Inventors: Koichi Mizuno, Nara; Hideaki Adachi, Osaka; Yo Ichikawa, Osaka; Kentaro Setsune, Osaka, all of Japan

[73] Assignee: Matsushita Electric Industrial Co., Ltd., Osaka, Japan

[21] Appl. No.: 80,726

[22] Filed: Jun. 24, 1993

[30] Foreign Application Priority Data

| Jun. 29, 1992 | [JP] | Japan | 4-170507 |
| Jun. 29, 1992 | [JP] | Japan | 4-170508 |
| Dec. 1, 1992 | [JP] | Japan | 4-321583 |

[51] Int. Cl.$^6$ ............................................. H01L 29/06
[52] U.S. Cl. ............................................. 257/39; 505/193
[58] Field of Search ............................ 257/36–39; 505/1, 505/701, 782, 785, 191, 193, 492, 501

[56] References Cited

U.S. PATENT DOCUMENTS

| 5,024,993 | 6/1991 | Kroger et al. . |
| 5,236,896 | 8/1993 | Nakamura et al. ............. 257/34 |

FOREIGN PATENT DOCUMENTS

| 0 324 999 A3 | 7/1989 | European Pat. Off. . |
| 0324044 | 7/1989 | European Pat. Off. . |
| 0 354 804 A3 | 2/1990 | European Pat. Off. . |
| 0 371 426 A3 | 6/1990 | European Pat. Off. . |
| 0 484 253 A3 | 5/1992 | European Pat. Off. . |
| 505259 | 9/1992 | European Pat. Off. . |
| 57-027079 | 2/1982 | Japan . |
| 63-283177 | 11/1988 | Japan . |
| 63-283178 | 11/1988 | Japan . |
| 01024476 | 1/1989 | Japan ................... 257/39 |
| 01205578 | 8/1989 | Japan ................... 257/39 |
| 1207982 | 8/1989 | Japan . |
| 2194665 | 8/1990 | Japan . |
| 02297982 | 12/1990 | Japan ................... 257/39 |
| 3102883 | 4/1991 | Japan . |

OTHER PUBLICATIONS

Adachi et al, "Dielectric Properties of PLZT Epitaxial Thin Films," Jap. J. Appl. Phys., vol. 22, Suppl. 22–2 1983, pp. 11–13.

Moodera et al, "In Situ Deposition of Superconducting Bi–Pb–Sr–Ca–Ca–O Thin Films on MgO . . . ," Appl. Phys. Lett., vol. 57, No. 23, 3 Dec. 1990, pp. 2498–2500.

Ramesh et al., "Ferroelectric Bismuth Titanate/Superconductor (YBaCuO) Thin Film heterostructures on Si," Appl. Phys. Lett., vol. 59, No. 14, 30 Sep. 1991, p. 1782–1784.

J. P. Goral et al., "Tem Investigation of the Ferroelectric Domain Structure in Sputtered PZT Thin Films", Material Research Bulletin, Symp. Proceed., vol. 200, 1990, Oxford GB, pp. 225–230.

B. W. Statt et al., "Stabilizing the High–$T_c$ Superconductor $Bi_2Sr_2Ca_2Cu_3O_{10+x}$ BY Pb Substitution", Physics G/Superconductivity, vol. 156, No. 2, Sep. 1, 1988, Amsterdam NL, pp. 251–255.

R. Ramesh et al., "Epitaxial Cuprate Superconductor/Ferroeelctric Heterostructures", Science, vol. 252, No. 5008, May 17, 1991, Lancaster, Pa. pp. 944–946.

T. Fujii et al., "Metal–Insulator –Superconductor Field–Effect–Transistor Using $SrTIO_3/YBa_2Cu_3O_y$ Heteroepitaxial Films", Japanese Journal of Applied Physics, Part 2, Letters, vol. 31, No. 5B, May 15, 1992, Tokyo, Japan, pp. L612–L615.

(List continued on next page.)

*Primary Examiner*—Sara W. Crane
*Attorney, Agent, or Firm*—Lowe Hauptman Gopstein Gilman & Berner

[57] ABSTRACT

A field-effect type superconducting device includes a channel layer. The channel layer includes Bi-based oxide compound containing Cu. A source electrode contacts the channel layer. A drain electrode contacts the channel layer. A gate insulating film made of insulating material extends on on the channel layer. A gate electrode extends on the gate insulating film.

32 Claims, 9 Drawing Sheets

OTHER PUBLICATIONS

J. Mannhart et al., "Influence of Electric Fields on Pinning In $YBa_2Cu_3O_7-\beta$ Films", Physical Review Letters, vol. 67, No. 15, Oct. 7, 1991, New York, pp. 2099–2101.

H. Tabata et al., "Preparation of $PbTiO_3$ Thin films By An Excimer Laser Ablation Technique With Second Laser Irradiation", Japanese Journal of Applied Physics, vol. 31, No. 9B, Sep. 1992, Toyoko, Japan, pp. 2968–2970.

K. Ismail et al., "Novel Properties of a 0.1–$\mu$m–Long Split–Gate MODFET", IEEE Electronic Device Letters, Oct. 11, 1990 No. 10, New York, US.

Zhongmin Wen et al., "Fabrication and Physical Properties of DC Squids Using Bi(Pb) SrCaCuO Thin Films", Physica C Superconductivity, Jun. 1, 1990 No. 1/2, Amsterdam, NL.

"Superconducting Proximity Effect in the Native Inversion Layer on InAs"; by H. Takayanagi et al; 1985 The American Physical Society; pp., 2449–2452.

"Influence Of Electric Fields On Pinning In $YBa_2Cu_3O_7$–Films" by J. Mannhart et al; 1991 The American Physical Society; pp., 2099–2101.

"Metal–Insulator–Superconductor Field–Effect–Transistor Using $SrTiO_3/BYa_2Cu_3Oy$ Heteroepitaxial Films"; by T. Fujii et al; Jpn. J. Appl. Phys. vol. 31(1992) pp., L612–L615; Part 2, No. 5B, 15 May 1992.

"Electric Field Effect in Hight Tc Superconducting Ultrathin $BYa_2Cu_3O_7$–x Films"; by C. Doughty et al; Appl. Phys. Lett. 59(26), 23 Dec. 1991; pp., 3470–3472.

FIELD-EFFECT TYPE SUPERCONDUCTING DEVICE INCLUDING BI-BASE OXIDE COMPOUND CONTAINING COPPER

BACKGROUND OF THE INVENTION

1. Field of the Invention

This invention relates to a field-effect type superconducting device.

2. Description of the Prior Art

Takayanagi and Kawakami observed a supercurrent through a 2DEG (two-dimensional electron-gas) in the inversion layer on p-type InAs, in addition to an ac Josephson effect, with superconducting electrodes separated by 0.2–0.5 $\mu$m (H. Takayanagi and T. Kawakami: Physical Review Letters 54, pp. 2449–2452, 1985). They also found that a junction with a metal gate electrode showed the controllability of the supercurrent by the gate voltage.

Mannhart et al reported experimental evidence that the pinning force and the critical current density of $YBa_2Cu_3O_{7-\delta}$ superconducting films could be controlled by electric fields (J. Mannhart et al: Physical Review Letters 67, pp. 2099–2101, 1991). In their view, this effect is attributed to an equal change of the global pinning force of magnetic-flux lines caused by the change of the density of mobile charge carriers with the applied electric fields. To apply electric fields to thin $YBa_2Cu_3O_{7-\delta}$ superconducting layers, they fabricated inverted metal-insulator-semiconductor FET-type (MISFET-type) heterostructures. In the MISFET-type heterostructures, a gate electrode was separated from the superconducting layer by a gate insulator made of $SrTiO_3$.

Xi et al made a multilayer high Tc superconducting field-effect transistor-like structure from ultrathin $YBa_2Cu_3O_{7-x}$ films (X. X. Xi et al: Appl. Phys. Lett. 59, pp. 3470–3472, 1991). They found that an epitaxially grown dielectric $SrTiO_3$ insulation layer, which had a forward bias breakdown voltage of about 20 V, allowed an electric field induced change in the channel layer of $1.25 \times 10^{13}$ carrier/$cm^2$ per volt of the gate voltage. In addition, they observed a significant modulation of the normal state and superconducting properties in samples with $YBa_2Cu_3O_{7-x}$ channel layers of a few unit cells thick. In this structure, by applying a gate voltage of different properties, Tc was both suppressed and enhanced by ~1 K. Furthermore, the resistance was modulated by as much as 20% in the normal state and by over 1,500% near the zero resistance temperature. In this structure, a gate electrode was separated from the superconducting channel layer by a gate insulator made of $SrTiO_3$.

Fujii et al fabricated planar-type metal-insulator-superconductor field-effect transistors (MISFET's) and investigated their current modulation characteristics (T. Fujii et al: Jpn. J. Appl. Phys. 31, pp L612–L615, May 1992). These MISFET's had a structure of Al-gate metal/(100) $SrTiO_3$-gate insulator/(001)$YBa_2Cu_3O_y$-channel. They found that apparent field-effect modulation of drain current was in both the normal (T>Tc) and superconducting (T<Tc) states. In the superconducting state, not only the critical current but also flux-flow resistance were appreciably changed according to the applied gate voltage.

Japanese published unexamined patent application 1-207982 discloses a superconducting field-effect transistor which includes a very-thin channel layer made of high Tc superconducting material such as $YBa_2Cu_3O_7$. The channel layer has a thickness of, for example, about 1 nm. A gate electrode is separated from the channel layer by a gate insulator made of $SrTiO_3$ which has a sufficiently great dielectric constant.

Japanese published unexamined patent application 63-283177 discloses a superconducting field-effect transistor which includes a channel layer made of superconducting oxide. A semiconductor layer adjoins the channel layer.

Japanese published unexamined patent application 63-283178 discloses a superconducting field-effect transistor which includes a channel layer made of superconducting oxide. A layer made of nonmagnetic transition metal compound (for example, $LaNiO_3$) adjoins the channel layer.

Japanese published unexamined patent application 3-102883 discloses a superconducting field-effect transistor in which a channel extending between a source electrode and a drain electrode includes superconducting regions and semiconducting regions alternating with each other. An electric current path between the source electrode and the drain electrode successively extends through the alternate superconducting and semiconducting regions.

Japanese published unexamined patent application 2-194665 discloses a superconducting field-effect transistor in which a source region and a drain region made of BiSrCaCuO are formed on a substrate made of MgO. A normally conductive region, a superconducting region, and a normally conductive region are sequentially arranged between the source region and the drain region. The superconducting region is made of BiSrCaCuO. The sequential arrangement of the normally conductive region, the superconducting region, and the normally conductive region forms a channel between the source region and the drain region. An electric current path between the source region and the drain region successively extends through the normally conductive region, the superconducting region, and the normally conductive region. A gate insulator made of MgO extends between the superconducting region and a gate electrode.

SUMMARY OF THE INVENTION

It is an object of this invention to provide an improved field-effect type superconducting device.

A first aspect of this invention provides a field-effect type superconducting device comprising a channel layer including Bi-based oxide compound containing Cu; a source electrode contacting the channel layer; a drain electrode contacting the channel layer; a gate insulating film made of insulating material and extending on the channel layer; and a gate electrode extending on the gate insulating film.

A second aspect of this invention provides a field-effect type superconducting device comprising an electrically conductive layer; an insulating layer extending on the electrically conductive layer; a channel layer extending on the insulating layer and including Bi-based oxide compound containing Cu; a source electrode contacting the channel layer; a drain electrode contacting the channel layer; and a gate electrode contacting the channel layer.

A third aspect of this invention provides a superconducting device comprising a channel layer including Bi-based oxide compound containing Cu; an electrode insulating film made of insulating material and extending on the channel layer; and a control electrode extending on the electrode insulating film and having a constricted portion.

A fourth aspect of this invention provides a superconducting device comprising a channel layer including Bi-based oxide compound containing Cu; an electrode insulating film made of insulating material and extending on the channel layer; and a pair of control electrodes extending on the electrode insulating film and having respective tapered portions which face each other.

DESCRIPTION OF THE PREFERRED EMBODIMENTS

Figure 1:
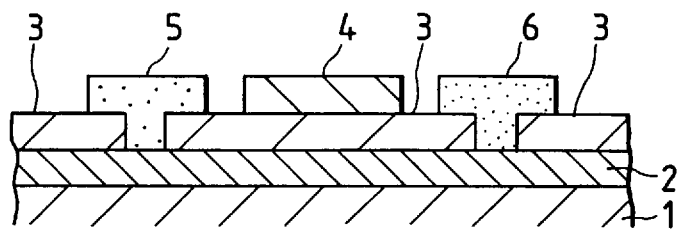
FIG. 1 is a sectional view of a first example of a superconducting device according to this invention.

Some of field-effect type superconducting devices of this invention include a channel layer, a source electrode contacting the channel layer, a drain electrode contacting the channel layer, a gate insulating film contacting the channel layer, and a gate electrode contacting the gate insulating film. The channel layer includes Bi-based oxide compound of a layer structure which contains Cu. The gate insulating film includes a thin film of oxide containing Bi or Pb. The Bi-based oxide compound in the channel layer is oriented with respect to the c-axis, and exhibits superconductivity at a low temperature. The gate insulating film contacts an a-b surface (plane) of the channel layer. The relation among the source electrode, the channel layer, and the drain electrode is designed so that a current between the source electrode and the drain electrode will flow along a-b planes of the channel layer. When an electric field is applied to the gate electrode, carriers concentrate on the a-b surface of the channel layer which contacts the gate electrode so that the distribution of carriers in an a-b plane under an equilibrium condition is modulated.

In a superconducting device of a first structure according to this invention, a channel layer is deposited on a substrate, and a gate insulating film is formed on the channel layer. In addition, a gate electrode is formed which contacts the gate insulating film. Furthermore, a source electrode and a drain electrode are formed which contact the channel layer.

In a superconducting device of a second structure according to this invention, an insulating film is deposited on an electrically-conductive substrate, and a channel layer is formed which contacts the insulating film. In addition, a gate electrode, a source electrode, and a drain electrode are formed which contact the channel layer.

In a superconducting device of a third structure according to this invention, an electrically-conductive buffer layer is formed on a substrate, and an insulating film is deposited on the buffer layer. In addition, a channel layer is formed which contacts the insulating film. Furthermore, a gate electrode, a source electrode, and a drain electrode are formed which contact the channel layer.

A superconducting device of a fourth structure according to this invention has a planar configuration. The planar configuration enables simplification of steps of the fabrication of the superconducting device. The superconducting device of the fourth structure is provided with at least two gate electrodes to enhance the efficiency of modulation by the field effect.

In a planar-configuration Josephson device according to this invention, a control electrode has a narrowed portion (bridge portion) with a width of 20 $\mu$m or smaller. The narrowed portion of the gate electrode changes electrical characteristics of a portion of a channel layer which opposes the narrowed portion. The characteristics of the Josephson device of this invention can be controlled by an externally-applied signal.

In some of field-effect type superconducting devices of this invention, a channel layer includes a laminated film or a multi-layer film having at least two sub layers made of Bi-based oxide compounds. This design enhances the field effect on the channel layer.

Some of superconducting devices of this invention can be used as nonvolatile memories. In these superconducting devices, gate insulating films are made of ferroelectric material.

In the previously-mentioned various superconducting devices of this invention, a channel layer includes oxide or superconducting oxide expressed as $(Bi_{1-y}Pb_y)_2An_2Ln_nCu_{n+1}O_{(2n+6)\pm\delta}$ where An denotes at least one of Sr, Ca, and Ba, and Ln denotes at least one of Sr, Ca, Ba, Y, and lanthanoids. In addition, n=0, 1, 2, 3, 4, 5, and $0 \leq \delta \leq 1$ and $0 \leq y \leq 0.5$. An insulating film or a gate insulating film includes ferroelectric containing Pb which is expressed as $(Pb_{1-x}La_x)(Zr_{1-y}Ti_y)_{1-x/4}O_3$ where $0 \leq x \leq 0.2$ and $0 \leq y \leq 1.0$.

Alternatively, the insulating film or the gate insulating film may include ferroelectric containing Bi which is expressed as $Bi_4Ti_3O_{12}$.

The inventors fabricated a superconducting device including a channel layer and a gate insulating film contacting the channel layer. The channel layer was made of Bi-based oxide compound of a layer structure which contained Cu. The Bi-based oxide compound in the channel layer was oriented with respect to the c-axis, and exhibited superconductivity at a low temperature. The gate insulating film was made of oxide containing Bi or Pb. Most of oxides which could be used as the gate insulating film were perovskite dielectric or ferroelectric. The inventors found that the normal state resistance of the channel layer at temperatures near Tc or the zero resistance temperature of the channel layer varied when an electric field was applied thereto via the gate insulating film. In cases where the channel layer was made of perovskite Bi-based oxide compound of a layer structure which was oriented with respect to the c-axis and the gate insulating film was made of perovskite oxide dielectric containing Bi or Pb which was oriented with respect to the c-axis, the channel layer and the gate insulating film were similar to each other in crystal structure, lattice constants, elements, and thermal expansion coefficient. In these cases, both the channel layer and the gate insulating film could be formed in oxidizing atmosphere. The gate insulating film could be formed on the channel layer by epitaxy. The inventors found that the thickness of the gate insulating film could be controlled at an atomic layer level and hence the gate insulating film could be thin and uniform, and that the density of defects in the gate insulating film was equal to a remarkably reduced value. The material for the gate insulating film had a relative dielectric constant of 100 or greater when being in the thin film. This value of the relative dielectric constant ensured good characteristics of the gate insulating film.

As previously described, in the superconducting device of the first structure according to this invention, the channel layer was deposited on the substrate, and the gate insulating film was formed on the channel layer. In addition, the gate electrode was formed which contacted the gate insulating film. Furthermore, the source electrode and the drain electrode were formed which contacted the channel layer. In the superconducting device of the first structure, the substrate could be one of general insulating substrates. The inventors found that the crystalline characteristics of the channel layer was improved and the temperature-resistance characteristic curve at around Tc was steeper when the substrate was made of single crystal or crystalline material. This caused an increased rate of modulation responsive to an applied electric field. Since the gate insulating film was deposited on the channel layer, the gate insulating film was prevented from undergoing a mechanical damage. Since it was unnecessary to perform a process of forming a film at a high temperature after the deposition of the gate insulating film, the insulating characteristics and the dielectric characteristics of the gate insulating film were maintained.

As previously described, in the superconducting device of the second structure according to this invention, the insulating film was deposited on the electrically-conductive substrate, and the channel layer was formed which contacted the insulating film. In addition, the gate electrode, the source electrode, and the drain electrode were formed which contact the channel layer. This superconducting device could be simplified in structure by using the substrate as the gate electrode or by forming a back electrode on a back side of the substrate. Since the channel layer was deposited on the insulating film, the channel layer was prevented from undergoing a mechanical damage. Since it was unnecessary to perform a high-temperature process after the deposition of the channel layer, the separation of oxygen from the channel layer was prevented and the superconducting characteristics were hardly deteriorated. Thus, it was possible to attain a good efficiency of control of the electrical characteristics of the channel layer in response to an applied electric field.

In the superconducting device where the control electrode was formed on the channel layer, the shape of the control electrode determined the effective shape of the channel layer. This superconducting device constituted a Josephson device having a bridge portion of a controllable shape. Alternatively, this superconducting device constituted a field-effect device having a channel of a controllable width. The inventors found that, in the Josephson device of this invention, various characteristics such as superconducting characteristics thereof were controlled in response to the magnitude of a voltage applied to the control electrode.

In cases where at least two gate electrodes were arranged in the superconducting device of this invention, a stronger electric field was developed when a voltage was applied between the gate electrodes. In cases where two paths of respective channel layers were provided and gate electrodes were formed in connection with the respective paths, the operations of the two channels could be complementary.

As previously described, in the superconducting device of the third structure according to this invention, the electrically-conductive buffer layer was formed on the substrate, and the insulating film was deposited on the buffer layer. In addition, the channel layer was formed which contacted the insulating film. Furthermore, the gate electrode, the source electrode, and the drain electrode were formed which contacted the channel layer. In this superconducting device, even when the substrate was one of general insulating substrates, there were advantages similar to the advantages of the superconducting devices having the electrically conductive substrate. The inventors found that the buffer layer made of Bi-base compound was very effective to cope with lattice mismatching between the substrate and the channel layer and a difference in thermal expansion coefficient between the substrate and the channel layer, and that the electrical characteristics of the channel layer was improved thereby. This superconducting device could be easily fabricated, and was good in practical use.

The inventors fabricated a field-effect type superconducting device in which a channel layer included a laminated film or a multi-layer film having at least two sub layers made of Bi-based oxide compounds. This design enhanced the field effect on the channel layer. Generally, oxide superconductors have small carrier densities, and various superconducting characteristics and various normal state characteristics thereof vary with the carrier density. The inventors discovered that the device characteristics depended on the carrier density in the channel layer and the condition of the carrier distribution. In cases where the channel layer included a laminated film or a multi-layer film having at least two sub layers made of Bi-based oxide compounds oriented with respect to the c-axes, the carrier density in the channel layer and the condition of the carrier distribution could be suitably designed. Thus, this superconducting device was good in performances. The characteristics of this superconducting device could be adjusted by varying the resistivity (that is, the carrier density or the mean free path) through element doping or element substitution on the Bi-based compounds, or by changing the order of the lamination of the layers, the combination of laminated materials, and the spatial period of the lamination to make the carrier distribution better in two-dimensionality (to control the coupling between the layers).

The inventors fabricated a superconducting device including a gate electrode made of ferroelectric material. The inventors found that, in this superconducting device, the zero resistance temperature or the normal state resistance of a channel layer was varied in response to the application of a voltage to the gate electrode, and that the variation in the zero resistance temperature or the normal state resistance continued after the removal of the applied voltage. It is thought that the applied voltage changes the carrier density, the carrier distribution, or the electric bonding energy, and thus causes a variation in the electrical characteristics. In addition, it is thought that the variation is continued by the residual dielectric polarization in the ferroelectric material. This superconducting device served as a nonvolatile memory.

As previously described, in the various superconducting devices of this invention, the channel layer included oxide or superconducting oxide expressed as $(Bi_{1-y}Pb_y)_2An_2Ln_nCu_{n+1}O_{(2n+6)\pm\delta}$ where An denotes at least one of Sr, Ca, and Ba, and Ln denotes at least one of Sr, Ca, Ba, Y, and lanthanoids. In addition, n=0, 1, 2, 3, 4, 5, and $0 \leq \delta \leq 1$ and $0 \leq y \leq 0.5$. The insulating film or the gate insulating film included ferroelectric containing Pb which was expressed as $(Pb_{1-x}La_x)(Zr_{1-y}Ti_y)_{1-x/4}O_3$ where $0 \leq x \leq 0.2$ and $0 \leq y \leq 1.0$. Alternatively, the insulating film or the gate insulating film included ferroelectric containing Bi which was expressed as $Bi_4Ti_3O_{12}$. The Bi-based compound in the channel layer was of the perovskite structure. Also, the Pb-based ferroelectric in the insulating film was of the perovskite structure. Therefore, the channel layer and the insulating film were similar to each other in lattice constants and thermal expansion coefficient, and the channel layer and the insulating film could be made into a lamination through epitaxy without deteriorating the electrical characteristics of the channel layer and the insulating film. The insulating film could be thin and good in crystalline characteristics, causing improved electrical characteristics of the device, a higher dielectric constant, improved insulating characteristics of the insulating film, and a reduction in the leak current. In the Pb-based ferroelectric of the insulating film, the Curie temperature was varied by changing the La atomic fraction (concentration) "x" or the Ti atomic fraction (concentration) "y". Thus, the dielectric constant could be large at an arbitrary operation temperature by suitably setting the Curie temperature. This is advantageous for practical use.

Typical superconducting devices of this invention include a channel layer and an insulating film or a gate insulating film. The channel layer includes oxide superconductor. The insulating film or the gate insulating film includes oxide dielectric. Regarding the oxide superconductor in the channel layer, a small carrier density is preferable and a low Tc is allowed. Oxide-based superconducting material, whose Tc can be varied by element substitution, is preferable in designing a superconducting device which can operate most efficiently at a given temperature. In a laminated film or a multi-layer film having a first sub layer made of superconductor of a given system and a second sub layer made of oxide of a system similar to the former system, the superconductivity can be controlled by the changing the structure of the lamination (for example, the combination of the materials, the order of the laminated layers, and the spatial lamination period). Thus, the laminated film or the multi-layer film is advantageous to form a good channel layer. It is preferable that the structure of the lamination is chosen in accordance with use of the superconducting device. In addition, it is preferable that the materials in a combination for the lamination have crystal structures of similar types. For example, a combination of Bi—Sr—Ca—Cu—O (2212 phase or 2223 phase) and Bi—Sr—Cu—O (2201 phase), and a combination of Bi—Sr—Ca—Cu—O and Bi—Sr—Ln—Cu—O (2212 phase, and Ln denotes Y or lanthanoid) are preferable. Furthermore, it is preferable that the materials for the sub layers of the lamination in the channel layer and the material for the insulating film have similar crystal structures and similar lattice constants. For example, Bi-based superconductors having similar crystal structures and similar lattice constants are used in the channel layer, and Pb-based perovskite ferroelectric is used in the insulating film. In superconducting devices having channel layers, insulating layers, buffer layers, substrate layers, and electrically conductive layers, when Bi-based compounds are used in these layers, the crystalline characteristics of the layers can be good. The good crystalline characteristics ensure good operation characteristics of the superconducting devices. Under this material choice, the insulating films can be thin and good in crystalline characteristics. These good insulating films are effective to improve the electrical characteristics of the channel layers.

The channel layer in the typical superconducting devices of this invention may include a combination or a lamination of an oxide superconducting sub layer and an oxide sub layer. The oxide superconducting sub layer mainly includes 2212-phase Bi-based material expressed as $(Bi_{1-y}Pb_y)_2$—$Sr_2$—$Ca_1$—$Cu_2$—$O_{8\pm\delta}$ where $0 \leq \delta \leq 1$ and $0 \leq y \leq 0.5$. Alternatively, the oxide superconducting sub layer mainly includes 2223-phase material expressed as $(Bi_{1-y}Pb_y)_2$—$Sr_2$—$Ca_2$—$Cu_3$—$O_{10\pm\delta}$ where $0 \leq \delta \leq 1$ and $0 \leq y \leq 0.5$. The oxide sub layer mainly includes 2212-phase material expressed as $(Bi_{1-y}Pb_y)_2$—$Sr_2$—$Ln_1$—$Cu_2$—$O_{8\pm\delta}$ where Ln denotes at least one of Y and lanthanoids, and $0 \leq \delta \leq 1$ and $0 \leq y \leq 0.5$. Alternatively, the oxide sub layer mainly includes 2201-phase Bi-based material expressed as $(Bi_{1-y}Pb_y)_2$—$Sr_2$—$Cu_1$—$O_{6\pm\delta}$ where $0 \leq \delta \leq 1$ and $0 \leq y \leq 0.5$. The insulating film in the typical superconducting devices of this invention may include ferroelectric containing Pb which is expressed as $(Pb_{1-x}La_x)(Zr_{1-y}Ti_y)_{1-x/4}O_3$ where $0 \leq x \leq 0.2$ and $0 \leq y \leq 1.0$. Alternatively, the insulating film may include ferroelectric containing Bi which is expressed as $Bi_4Ti_3O_{12}$.

In cases where two gate electrodes opposing each other via a small spacing are formed on a gate insulating film, an interelectrode gap is narrow so that an enhanced electric field can be developed and an increased electric-field effect can be attained.

In cases where at least a channel layer, a gate insulating layer, an electrically conductive layer, and a gate electrode are formed in a same vacuum, a layer of a low dielectric constant is prevented from occurring in the boundary between the surface of the gate insulating film and the surface of the channel layer, the gate electrode, or the electrically conductive layer. Accordingly, conditions of the boundary can be held good. In addition, an improved reproducibility of device characteristics, an enhanced device stability, and an increased device modulation efficiency can be attained.

In the previously-mentioned superconducting device including the insulating film having ferroelectricity, the insulating film serves to hold the field effect. Thus, this superconducting device can be used as a memory. The memory formed by the superconducting device occupies only a small area so that the memory is useful in providing a highly integrated memory circuit.

In the previously-mentioned superconducting device having at least two gate electrodes, a pair of complementary circuit elements can be formed. Thus, this superconducting device is useful in providing a logic operation circuit.

As understood from the previous description, the superconducting devices of this invention are of the multi-layer structure (laminated structure). Generally, the multi-layer structure is suited to providing an integrated circuit. As previously described, some of the superconducting devices of this invention include the channel layers of the laminated structure. The laminated structure in the channel layer enables the formation of a gate insulating film which provides a high modulation efficiency.

EXAMPLE 1

FIG. 1 shows a first example of a field-effect type superconducting device according to this invention. As shown in FIG. 1, the superconducting device includes a substrate 1 on which a channel layer 2 extends. The substrate 1 is made of (100)-oriented MgO single crystal. A gate insulating film 3 extends on the channel layer 2. The gate insulating film 3 has through holes into which a source electrode 5 and a drain electrode 6 extends. The gage insulating film 3 has a thickness of 200 nm. The gate insulating film 3 is made of $SrTiO_3$. Lower ends of the source electrode 5 and the drain electrode 6 contact the channel layer 2. The source electrode 5 and the drain electrode 6 are made of Pt. A gate electrode 4 extends on an area of the gate insulating film 3 between the source electrode 5 and the drain electrode 6. The gate electrode 4 is made of Pt.

Figure 2:
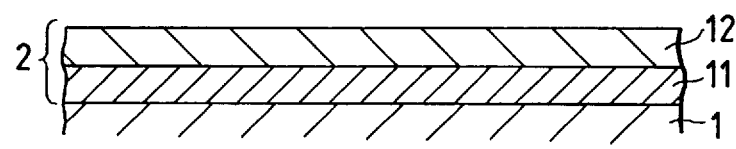
FIG. 2 is a sectional view of a channel layer in FIG. 1.

As shown in FIG. 2, the channel layer 2 has a multi-layer (laminated) structure. Specifically, the channel layer 2 has superposition of a lower sub layer 11 and an upper sub layer 12. The lower sub layer 11 which extends on the substrate 1 is a thin film having a thickness of 30 nm. The thin film 11 is made of Bi-based oxide superconductor mainly including 2212-phase oxide superconductor. The Bi-based oxide superconductor in the thin film 11 is expressed as $Bi_2$—$Sr_2$—$Ca_1$—$Cu_2$—$O_{8\pm\delta}$ where $0 \leq \delta \leq 1$. The upper sub layer 12 which extends on the lower sub layer 11 is a thin film having a thickness of 30 nm. The thin film 12 is made of oxide mainly including 2212-phase Bi-based oxide expressed as $Bi_2$—$Sr_2$—$Nd_1$—$Cu_2$—$O_{8\pm\delta}$ where $0 \leq \delta \leq 1$.

Experiments were performed to measure the characteristics of the superconducting device. The conductance between the source electrode 5 and the drain electrode 6 was varied in response to whether or not a voltage was applied to the gate electrode 4. Under conditions where a constant current remained driven between the source electrode 5 and the drain electrode 6, the voltage between the source electrode 5 and the drain electrode 6 was modulated in accordance with a control voltage at the gate electrode 4. Thus, it was confirmed that the superconducting device operated as a field-effect type. The available field effect was conspicuous at a temperature of the device in the range of 20 K to 100 K.

The superconducting device was fabricated as follows. First, a (100)-oriented MgO substrate 1 was prepared. In a vacuum, a thin film 11 having a thickness of 30 nm was deposited on the substrate 1 by RF magnetron sputtering which used an oxide powder target. This oxide powder target was adjusted so that Bi-based oxide superconductor mainly including 2212-phase oxide superconductor could be deposited. The Bi-based oxide superconductor in the thin film 11 was expressed as $Bi_2$—$Sr_2$—$Ca_1$—$Cu_2$—$O_{8\pm\delta}$ where $0 \leq \delta \leq 1$. During the sputtering to form the thin film 11, the temperature of the substrate 1 was held at 650° C.

Subsequently, in the same vacuum, a thin film 12 having a thickness of 30 nm was deposited on the thin film 11 by RF magnetron sputtering which used an oxide powder target. This oxide powder target was adjusted so that oxide mainly including 2212-phase Bi-based oxide could be deposited. The Bi-based oxide in the thin film 12 was expressed as $Bi_2$—$Sr_2$—$Nd_1$—$Cu_2$—$O_{8\pm\delta}$ where $0 \leq \delta \leq 1$. During the sputtering to form the thin film 12, the temperature of the substrate 1 was held at 650° C. The thin films 11 and 12 composed a channel layer 2. Then, in the same vacuum, an $SrTiO_3$ film having a thickness of 200 nm was deposited on the channel layer 2 by a suitable process such as an RF sputtering process. During the deposition of the $SrTiO_3$ film, the temperature of the substrate 1 was held at 650° C.

The channel layer 2 and the $SrTiO_3$ film were made into a channel configuration by a patterning process using ion milling and photolithography. The photolithography employed a negative photoresist. Contact holes for accommodating a source electrode and a drain electrode were formed through the $SrTiO_3$ film by ion milling. Thus, the $SrTiO_3$ film was processed into a gate insulating film 3. Then, a Pt film was deposited on the gate insulating film 3 and exposed areas of the channel layer 2. The Pt film was made into a gate electrode 4, a source electrode 5, and a drain electrode 6 by a patterning process using ion milling. As a result, the superconducting device was completed.

EXAMPLE 2

Figure 3:
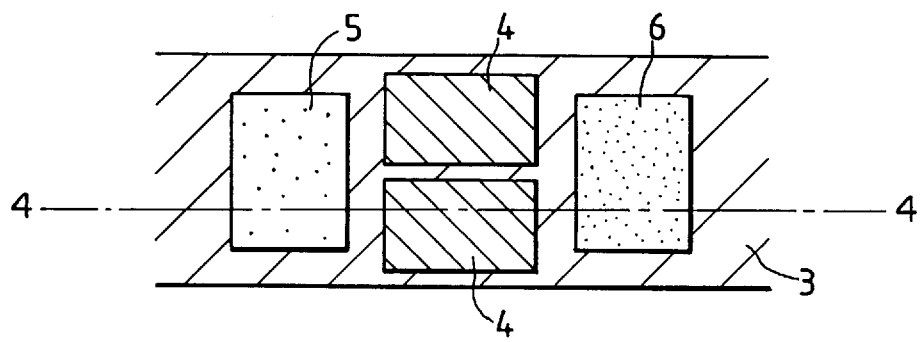
FIG. 3 is a top view of a second example of a superconducting device according to this invention.
Figure 4:
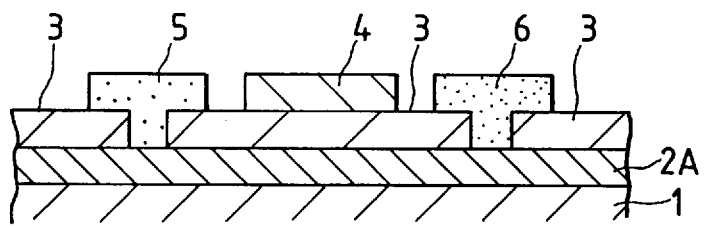
FIG. 4 is a sectional view taken along the line A—A of FIG. 3.

FIGS. 3 and 4 show a second example of a field-effect type superconducting device according to this invention. As shown in FIGS. 3 and 4, the superconducting device includes a substrate 1 on which a channel layer 2A extends. The substrate 1 is made of (100)-oriented MgO single crystal. A gate insulating film 3 extends, on the channel layer 2A. The gate insulating film 3 has through holes into which a source electrode 5 and a drain electrode 6 extends. The gate insulating film 3 has a thickness of 480 nm. The gate insulating film 3 is made of $SiO_2$. Lower ends of the source electrode 5 and the drain electrode 6 contact the channel layer 2A. The source electrode 5 and the drain electrode 6 are made of Pt. A pair of gate electrodes 4 extend on an area of the gate insulating film 3 between the source electrode 5 and the drain electrode 6. The gate electrodes 4 are spaced from each other by a gap of 2 $\mu$m. The gate electrodes 4 are made of Pt.

Figure 5:
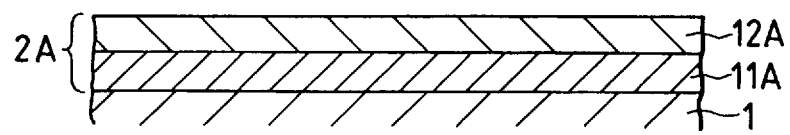
FIG. 5 is a sectional view of a channel layer in FIG. 4.

As shown in FIG. 5, the channel layer 2A has a multi-layer (laminated) structure. Specifically, the channel layer 2A has superposition of a lower sub layer 11A and an upper sub layer 12A, The lower sub layer 11A which extends on the substrate 1 is a thin film having a thickness of 30 nm. The thin film 11A is made of oxide mainly including 2201-phase Bi-based oxide expressed as $Bi_2$—$Sr_2$—$Cu_1$—$O_{6\pm\delta}$ where $0 \leq \delta \leq 1$. The upper sub layer 12A which extends on the lower sub layer 11A is a thin film having a thickness of 30 nm. The upper sub layer 12A is made of oxide superconductor mainly including 2223-phase Bi-based oxide superconductor expressed as $Bi_2$—$Sr_2$—$Sr_2$—$Cu_3$—$O_{10\pm\delta}$ where $0 \leq \delta \leq 1$.

Experiments were performed to measure the characteristics of the superconducting device. The conductance between the source electrode 5 and the drain electrode 6 was varied in response to whether or not a same voltage was applied to the gate electrodes 4. In addition, the conductance between the source electrode 5 and the drain electrode 6 was varied in response to whether or not different voltages were applied to the gate electrodes 4 respectively. Under conditions where a constant current remained driven between the source electrode 5 and the drain electrode 6, the voltage between the source electrode 5 and the drain electrode 6 was modulated in accordance with a control voltage at the gate electrodes 4. Thus, it was confirmed that the superconducting device operated as a field-effect type. The available field effect was conspicuous at a temperature of the device in the range of 20 K to 110 K. In addition, the available field effect was enhanced when different voltages were applied to the gate electrodes 4 respectively.

It was found that the 2201-phase Bi-based oxide layer 11A served as a buffer layer which was effective to improve the superconducting characteristics and the crystalline characteristics of the 2223-phase Bi-based oxide superconducting layer 12A.

The superconducting device was fabricated as follows. First, a (100)-oriented MgO substrate 1 was prepared. In a vacuum, a thin film 11A having a thickness of 30 nm was deposited on the substrate 1 by RF magnetron sputtering which used an oxide powder target. This oxide powder target was adjusted so that oxide mainly including 2201-phase Bi-based oxide could be deposited. The Bi-based oxide in the thin film 11A was expressed as $Bi_2$—$Sr_2$—$Cu_1$—$O_{6\pm\delta}$ where $0 \leq \delta \leq 1$. During the sputtering to form the thin film 11A, the temperature of the substrate 1 was held at 650° C. Subsequently, in the same vacuum, a thin film 12A having a thickness of 30 nm was deposited on the thin film 11A by RF magnetron sputtering which used an oxide powder target. This oxide powder target was adjusted so that oxide superconductor mainly including 2223-phase Bi-based oxide superconductor could be deposited. The Bi-based oxide superconductor in the thin film 12A was expressed as $Bi_2$—$Sr_2$—$Sr_2$—$Cu_3$—$O_{10\pm\delta}$ where $0 \leq \delta \leq 1$. During the sputtering to form the thin film 12A, the temperature of the substrate 1 was held at 650° C. The thin films 11A and 12A composed a channel layer 2A. Then, in the same vacuum, an $SiO_2$ film having a thickness of 480 nm was deposited on the channel layer 2A by RE sputtering. During the deposition of the $SiO_2$ film, the temperature of the substrate 1 was held at 200° C.

The channel layer 2A and the $SiO_2$ film were made into a channel configuration by a patterning process using ion milling and photolithography. The photolithography employed a negative photoresist. Contact holes for accommodating a source electrode and a drain electrode were formed through the $SiO_2$ film by ion milling. Thus, the $SiO_2$ film was processed into a gate insulating film 3. Then, a Pt film was deposited on the gate insulating film 3 and exposed areas of the channel layer 2A. The Pt film was made into gate electrodes 4, a source electrode 5, and a drain electrode 6 by a patterning process using ion milling. As a result, the superconducting device was completed.

EXAMPLE 3

A third example of a field-effect type superconducting device according to this invention is similar to the first example (see FIGS. 1 and 2) except for design changes indicated hereinafter.

Figure 6:
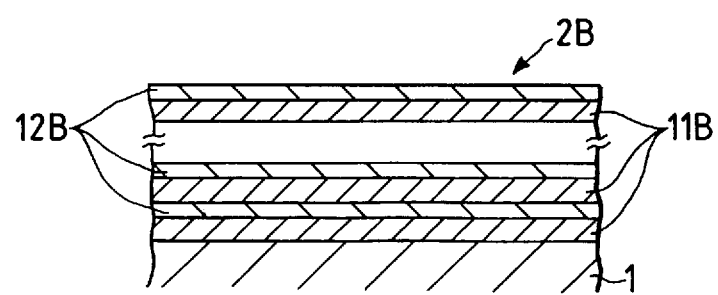
FIG. 6 is a sectional view of a channel layer in a third example of a superconducting device according to this invention.

As shown in FIG. 6, a channel layer 2B of the superconducting device has superposition of first-type sub layers 11B and second-type sub layers 12B. The first-type sub layers 11B alternate with the second-type sub layers 12B. The lowermost sub layer extending on a substrate 1 is of the first type. The uppermost sub layer is of the second type. For instance, both the number of the first-type sub layers 11B and the number of the second-type sub layers 12B are equal to four.

Each of the first-type sub layers 11B is a thin film having a thickness of 3 nm. The thin films 11B are made of oxide superconductor mainly including 2212-phase Bi-based oxide superconductor expressed as $Bi_2$—$Sr_2$—$Sr_1$—$Cu_2$—$O_{8\pm\delta}$ where $0 \leq \delta \leq 1$. Each of the second-type sub layers 12B is a thin film having a thickness of 2.4 nm. The thin films 12B are made of oxide mainly including 2201-phase Bi-based oxide expressed as $Bi_2$—$Sr_2$—$Cu_1$—$O_{6\pm\delta}$ where $0 \leq \delta \leq 1$.

A gate insulating film of the superconducting device has a thickness of 100 nm. The gate insulating film is made of Bi—Ti—O.

The superconducting device has a pair of gate electrodes spaced from each other by a gap of 2 μm.

During the deposition of the channel layer 2B, the temperature of the substrate 1 was held at 650° C. In addition, during the deposition of the gate insulating film, the temperature of the substrate I was held at 650° C.

Experiments were performed to measure the characteristics of the superconducting device. The conductance between a source electrode and a drain electrode was varied in response to whether or not a same voltage was applied to the gate electrodes. In addition, the conductance between the source electrode and the drain electrode was varied in response to whether or not different voltages were applied to the gate electrodes respectively. The characteristics of the superconducting device, especially the temperature of the superconducting device at which the field effect was conspicuous, depended on the configuration and the thicknesses of the sub layers 11B and 12B in the channel layer 2B. The Bi—Ti—O gate insulating film epitaxially grew on the channel layer 2B, and was essentially free from defects. The gate insulating film exhibited good performances.

EXAMPLE 4

Figure 7:
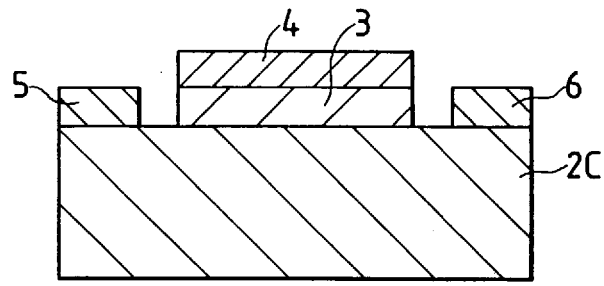
FIG. 7 is a sectional view of a fourth example of a superconducting device according to this invention.

FIG. 7 shows a fourth example of a field-effect type superconducting device according to this invention. As shown in FIG. 7, the superconducting device includes a channel layer 2C made of a single crystal of 2212-phase Bi-based oxide superconductor expressed as $Bi_2$—$Sr_2$—$Sr_1$—$Cu_2$—$O_{8\pm\delta}$ where $0 \leq \delta \leq 1$. The channel layer 2C has a thickness of about 0.5 mm. A source electrode 5 and a drain electrode 6 extend on separated areas of the channel layer 2C respectively. The source electrode 5 and the drain electrode 6 are made of Pt. A gate insulating film 3 extends on an area of the channel layer 2C between the source electrode 5 and the drain electrode 6. The gate insulating film 3 has a thickness of 400 nm. The gate insulating film 3 is made of $Pb_{0.9}La_{0.1}TiO_3$. A gate electrode 4 is superposed on the gate insulating film 3. The gate electrode 4 is made of Pt.

Experiments were performed to measure the characteristics of the superconducting device. The conductance between the source electrode 5 and the drain electrode 6 was varied in response to whether or not a voltage was applied between the gate electrode 4 and the channel layer 2C. The gate insulating film 3 exhibited ferroelectricity so that the varied conductance between the source electrode 5 and the drain electrode 6 continued after the applied voltage was removed. The temperature of the superconducting device, at which the field effect was conspicuous, depended on the oxygen concentration of the channel layer 2C. The gate insulating, film 3 had the perovskite crystal structure and epitaxially grew on. The channel layer 2C, and was essentially free from defects. The gate insulating film 3 exhibited good performances.

The superconducting device was fabricated as follows. First, a suitable-size block of single crystal of 2212-phase Bi-based oxide superconductor was prepared by cleavage. The Bi-based oxide superconductor was expressed as $Bi_2$—$Sr_2$—$Sr_1$—$Cu_2$—$O_{8\pm\delta}$ where $0\leq\Delta\leq1$. The prepared single crystal block had a thickness of about 0.5 mm. The prepared single crystal block formed a channel layer 2C. The channel layer 2C was fixed to a suitable support or a substrate. Then, a gate insulating film 3 having a thickness of 400 nm was deposited on a given area of the channel layer 2C by RF sputtering. The gate insulating film 3 was made of $Pb_{0.9}La_{0.1}TiO_3$. During the deposition of the gate insulating film 3, the temperature of the channel layer 2C was held at 540° C. Subsequently, a gate electrode 4 was formed on the gate insulating film 3 while a source electrode 5 and a drain electrode were formed on exposed areas of the channel layer 2C by sputtering which used a metal mask. The gate electrode 4, the source electrode 5, and the drain electrode 6 were made of Pt. As a result, the superconducting device was completed.

EXAMPLE 5

Figure 8:
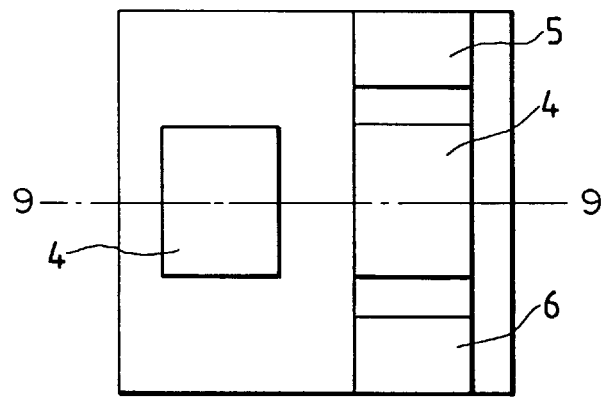
FIG. 8 is a top view of a fifth example of a superconducting device according to this invention.
Figure 9:
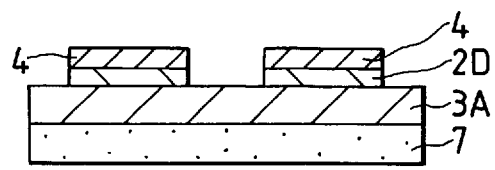
FIG. 9 is a sectional view taken along the line B—B of FIG. 8.

FIGS. 8 and 9 show a fifth example of a field-effect type superconducting device according to this invention. As shown in FIGS. 8 and 9, the superconducting device includes a substrate 7 on which an insulating film 3A extends. The substrate 7 is made of (100)-oriented Nb-doped $SrTiO_3$ single crystal. The insulating film 3A has a thickness of 400 nm. The insulating film 3A is essentially made of $Pb(Zr_{0.5}Ti_{0.5})O_3$. Channel layers 2D extend on given areas of the insulating film 3A. The channel layers 2D have a thickness of 50 nm. The channel layers 2D are made of Bi-based oxide superconductor mainly including 2212-phase oxide superconductor. The Bi-based oxide superconductor in the channel layers 2D is expressed as $Bi_2$—$Sr_2$—$Ca_1$—$Cu_2$—$O_{8\pm\delta}$ where $0\leq\delta\leq1$. A gate electrode 4, a source electrode 5, and a drain electrode 6 extend on separated areas of one of the channel layers 2D. The gate electrode 4 is located between the source electrode 5 and the drain electrode 6. Another gate electrode 4 extends on the other of the channel layers 2D. The gate electrodes 4, the source electrode 5, and the drain electrode 6 are made of Pt.

Experiments were performed to measure the characteristics of the superconducting device. The conductance between the source electrode 5 and the drain electrode 6 was varied in response to whether or not a voltage was applied between the gate electrodes 4. Under conditions where a constant current remained driven between the source electrode 5 and the drain electrode 6, the voltage between the source electrode 5 and the drain electrode 6 was modulated in accordance with a control voltage at the gate electrodes 4. Thus, it was confirmed that the superconducting device operated as a field-effect type. The substrate 7 was electrically conductive so that it served as an electrically conductive layer. The varied conductance between the source electrode 5 and the drain electrode 6 continued after the applied voltage was removed. The available field effect was conspicuous at a temperature of the device in the range of 20 K to 100 K.

The superconducting device was fabricated as follows. First, a (100)-oriented Nb-doped $SrTiO_3$ substrate 7 was prepared. In a vacuum, a Pb—Zr—Ti—$O_3$ insulating film 3A having a thickness of 400 nm was deposited on the substrate 7 by RF magnetron sputtering which used an oxide powder target. This oxide powder target was adjusted so that the composition of the deposited insulating film 3A could be essentially expressed as $Pb(Zr_{0.5}Ti_{0.5})O_3$. During the sputtering to form the insulating film 3A, the temperature of the substrate 7 was held at 650° C. Subsequently, in the same vacuum, a superconducting film having a thickness of 50 nm was deposited on the insulating film 3A by RF magnetron sputtering which used an oxide powder target. This oxide powder target was adjusted so that Bi-based oxide superconductor mainly including 2212-phase oxide superconductor could be deposited. The Bi-based oxide superconductor in the superconducting film was expressed as $Bi_2$—$Sr_2$—$Sr_2$—$Ca_1$—$Cu_2$—$O_{8\pm\delta}$ where $0\leq\delta\leq1$. During the sputtering to form the superconducting film, the temperature of the substrate 7 was held at 650° C.

In the same vacuum, the substrate 7 was cooled to a room temperature, and then a Pt film was deposited on the superconducting film. The superconducting film and the Pt film were made into channel layers 2D, gate electrodes 4, a source electrode 5, and a drain electrode 6 by a patterning process using ion milling and photolithography. The photolithography employed a negative photoresist. As a result, the superconducting device was completed.

EXAMPLE 6

Figure 10A:
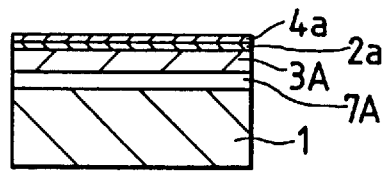
FIGS. 10(a) to 10(d) are sectional views of various layers on a substrate in different states which occur during the fabrication of a sixth example of a superconducting device according to this invention.
Figure 10B:
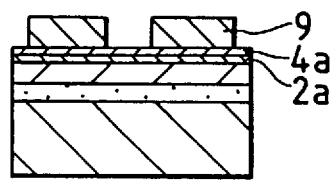
Figure 10C:
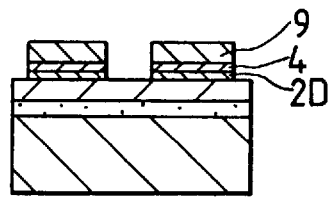
Figure 10D:
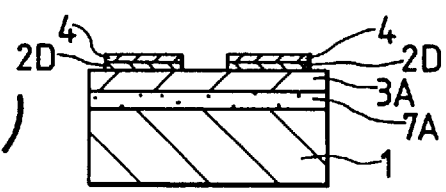

FIG. 10(d) shows a sixth example of a field-effect type superconducting device according to this invention. As shown in FIG. 10(d), the superconducting device includes a substrate 1 on which an electrically conductive layer 7A extends. The substrate 1 is made of (100)-oriented MgO single crystal. The electrically conductive layer 7A has a thickness of 300 nm. The electrically conductive layer 7A is mainly made of 2201-phase Bi-based oxide expressed as $Bi_2$—$Sr_2$—$Cu_1$—$O_{6\pm\delta}$ where $0\leq\delta\leq1$. An insulating film 3A is superposed on the electrically conductive layer 7A. The insulating film 3A has a thickness of 470 nm. The insulating film 3A is made of Pb—La—Ti—O. Channel layers 2D extend on given areas of the insulating film 3A. The channel layers 2D have a thickness of 50 nm. The channel layers 2D are mainly made of 2223-phase Bi-based oxide superconductor expressed as $Bi_2$—$Sr_2$—$Sr_2$—$Cu_3$—$O_{10\pm\delta}$ where $0\leq\delta\leq1$. A gate electrode 4, a source electrode, and a drain electrode extend on separated areas of one of the channel layers 2D as in the superconducting device of FIGS. 8 and 9. The gate electrode 4 is located between the source electrode 5 and the drain electrode 6. Another gate electrode 4 extends on the other of the channel layers 2D. The gate electrodes 4 are spaced from each other by a gap of 2 μm. The gate electrodes 4, the source electrode 5, and the drain electrode 6 are made of Pt.

Experiments were performed to measure the characteristics of the superconducting device. The conductance between the source electrode and the drain electrode was varied in response to whether or not a same voltage was applied to the gate electrodes 4. In addition, the conductance between the source electrode and the drain electrode was varied in response to whether or not different voltages were applied to the gate electrodes 4 respectively. Under conditions where a constant current remained driven between the source electrode and the drain electrode, the voltage between the source electrode and the drain electrode was modulated in accordance with a control voltage at the gate electrodes 4. Thus, it was confirmed that the superconducting device operated as a field-effect type. The varied conductance between the source electrode and the drain electrode continued after the applied voltage was removed. The continuation of the varied conductance corresponded to a memory function. The available field effect was conspicuous at a temperature of the device in the range of 20 K to 110 K. In addition, the available field effect was enhanced when different voltages were applied to the gate electrodes 4 respectively.

Two gate electrodes may be formed on a single channel layer. In this case, when different voltages are applied to the gate electrodes respectively, the conductances of the regions of the channel layer which extend below the respective gate electrodes vary in opposite directions respectively. The variations in the conductances are complementary.

The superconducting device was fabricated as follows. First, as shown in FIG. 10(a), a (100)-oriented MgO substrate 1 was prepared. In a vacuum, an electrically conductive layer 7A was deposited on the substrate 1 as shown in FIG. 10(a). The electrically conductive layer 7A had a thickness of 300 nm. The electrically conductive layer 7A was mainly made of 2201-phase Bi-based oxide expressed as $Bi_2$—$Sr_2$—$Cu_1$—$O_{6\pm\delta}$ where $0 \leq \delta \leq 1$. During the deposition of the electrically conductive layer 7A, the temperature of the substrate 1 was held at 650° C. Subsequently, in the same vacuum, as shown in FIG. 10(a), a Pb—La—Ti—O insulating film 3A was deposited on the electrically conductive layer 7A by RF sputtering using a target. This target was adjusted so that the composition of the insulating film 3A could be approximately expressed as $(Pb_{0.9}La_{0.1})TiO_3$. Specifically, the target employed sintered material which was compensated in Pb by 10%. The insulating film 3A had a thickness of 470 nm. During the deposition of the insulating film 3A, the temperature of the substrate 1 was held at 550° C. Accordingly, after the deposition of the electrically conductive layer 7A but before the deposition of the insulating film 3A, the temperature of the substrate 1 was lowered by 100° C.

Subsequently, in the same vacuum, as shown in FIG. 10(a), a superconducting film 2a having a thickness of 50 nm was deposited on the insulating film 3A by RF sputtering which used an oxide powder target. This oxide powder target was adjusted so that Bi-based oxide superconductor mainly including 2223-phase oxide superconductor could be deposited. The Bi-based oxide superconductor in the superconducting film 2a was expressed as $Bi_2$—$Sr_2$—$Sr_2$—$Cu_3$—$O_{10\pm\delta}$ where $0 \leq \delta \leq 1$. During the sputtering to form the superconducting film 2a, the temperature of the substrate 1 was held at 650° C. Accordingly, after the deposition of the insulating film 3A but before the deposition of the superconducting film 2a, the temperature of the substrate 1 was raised by 100° C.

Then, in the same vacuum, the substrate 7 was cooled to a room temperature, and then a Pt film 4a was deposited on the superconducting film 2a as shown in FIG. 10(a). A given pattern of resist 9 was formed on the Pt film 4a as shown in FIG. 10(b). The pattern of the resist 9 corresponded to a desired configuration of gate electrodes, a source electrode, and a drain electrode. As shown in FIG. 10(c), the portions of the Pt film 4a and the superconducting film 2a which were uncovered from the resist 9 were removed. Thus, the superconducting film 2a and the Pt film 4a were made into channel layers 2D, gate electrodes 4, a source electrode, and a drain electrode by a patterning process using ion milling and photolithography. Finally, as shown in FIG. 10(d), the resist 9 was removed. As a result, the superconducting device was completed.

The insulating film 3A exhibited good ferroelectricity. At a room temperature, the amount of residual charges in the insulating film 3A was equal to about 10 $\mu C/cm^2$, and the level of an electric field in the insulating film 3A was equal to about 88 KV/cm. Since no high-temperature process was present after the formation of the superconducting film 2a, it was possible to avoid a deterioration in the superconducting characteristics of the film 2a.

EXAMPLE 7

Figure 11:
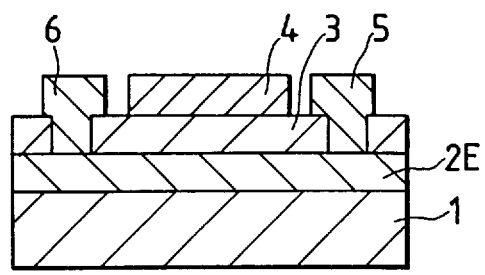
FIG. 11 is a sectional view of a seventh example of a superconducting device according to this invention.

FIG. 11 shows a seventh example of a field-effect type superconducting device according to this invention. As shown in FIG. 11, the superconducting device includes a substrate 1 on which a channel layer 2E extends. The substrate 1 is made of (100)-oriented MgO single crystal. A gate insulating film 3 extends on the channel layer 2E. The gate insulating film 3 has a thickness of 400 nm. The gate insulating film 3 has through holes into which a source electrode 5 and a drain electrode 6 extends. The gate insulating film 3 is made of $PbTiO_3$. Lower ends of the source electrode 5 and the drain electrode 6 contact the channel layer 2E. The source electrode 5 and the drain electrode 6 are made of Pt. A gate electrode 4 extends on an area of the gate insulating film 3 between the source electrode 5 and the drain electrode 6. The gate electrode 4 is made of Pt.

Figure 12:
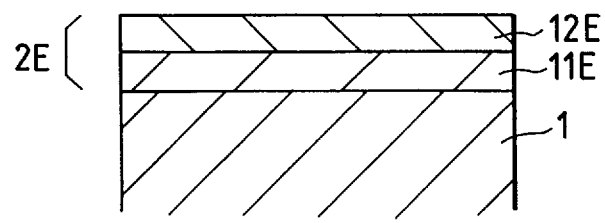
FIG. 12 is a sectional view of a channel layer in FIG. 11.

As shown in FIG. 12, the channel layer 2E has a multilayer (laminated) structure. Specifically, the channel layer 2E has superposition of a lower sub layer 11E and an upper sub layer 12E. The lower sub layer 11E which extends on the substrate 1 is a thin film having a thickness of 30 nm. The thin film 11E is made of Bi-based oxide superconductor mainly including 2212-phase oxide superconductor. The Bi-based oxide superconductor in the thin film 11E is expressed as $Bi_2$—$Sr_2$—$Ca_1$—$Cu_2$—$O_{8\pm\delta}$ where $0 \leq \delta \leq 1$. The upper sub layer 12E which extends on the lower sub layer 11E is a thin film having a thickness of 30 nm. The thin film 12E is made of oxide mainly including 2212-phase Bi-based oxide expressed as $Bi_2$—$Sr_2$—$Nd_1$—$Cu_2$—$O_{8\pm\delta}$ where $0 \leq \delta \leq 1$.

Experiments were performed to measure the characteristics of the superconducting device. The conductance between the source electrode 5 and the drain electrode 6 was varied in response to whether or not a voltage was applied to the gate electrode 4. Under conditions where a constant current remained driven between the source electrode 5 and the drain electrode 6, the voltage between the source electrode 5 and the drain electrode 6 was modulated in accordance with a control voltage at the gate electrode 4. Thus, it was confirmed that the superconducting device operated as a field-effect type. The available field effect was conspicuous at a temperature of the device in the range of 20 K to 100 K.

The superconducting device was fabricated as follows. First, a (100)-oriented MgO substrate 1 was prepared. In a vacuum, a thin film 11E having a thickness of 30 nm was deposited on the substrate 1 by RF magnetron sputtering which used an oxide powder target. This oxide powder target was adjusted so that Bi-based oxide superconductor mainly including 2212-phase oxide superconductor could be deposited. The Bi-based oxide superconductor in the thin film 11E was expressed as $Bi_2$—$Sr_2$—$Ca_1$—$Cu_2$—$O_{8\pm\delta}$ where $0 \leq \delta \leq 1$. During the sputtering to form the thin film 11E, the temperature of the substrate 1 was held at 650° C. Subsequently, in the same vacuum, a thin film 12E having a thickness of 30 nm was deposited on the thin film 11E by RF magnetron sputtering which used an oxide powder target. This oxide powder target was adjusted so that oxide mainly including 2212-phase Bi-based oxide could be deposited. The Bi-based oxide in the thin film 12E was expressed as $Bi_2$—$Sr_2$—$Nd_1$—$Cu_2$—$O_{8\pm\delta}$ where $0 \leq \delta \leq 1$. During the sputtering to form the thin film 12E, the temperature of the substrate 1 was held at 650° C. The thin films 11E and 12E composed a channel layer 2E. Then, in the same vacuum, a $PbTiO_3$ film having a thickness of 400 nm was deposited on the channel layer 2E by a suitable process such as an RF sputtering process. Before the deposition to form the $PbTiO_3$ film, the temperature of the substrate 1 was lowered to 600° C. During the deposition of the $PbTiO_3$ film, the temperature of the substrate 1 was held at 600° C.

The channel layer 2E and the PbTiO$_3$ film were made into a channel configuration by a patterning process using ion milling and photolithography. The photolithography employed a negative photoresist. Contact holes for accommodating a source electrode and a drain electrode were formed through the PbTiO$_3$ film by ion milling. Thus, the PbTiO$_3$ film was processed into a gate insulating film 3. Then, a Pt film was deposited on the gate insulating film 3 and exposed areas of the channel layer 2E. The Pt film was made into a gate electrode 4, a source electrode 5, and a drain electrode 6 by a patterning process using a lift-off technique. As a result, the superconducting device was completed.

EXAMPLE 8

Figure 13:
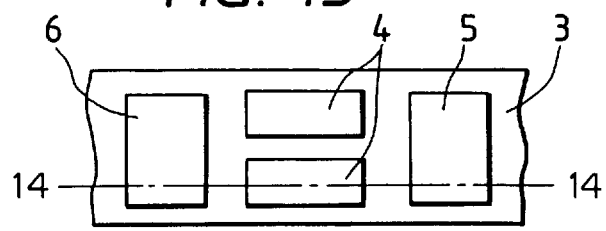
FIG. 13 is a top view of an eighth example of a superconducting device according to this invention.
Figure 14:
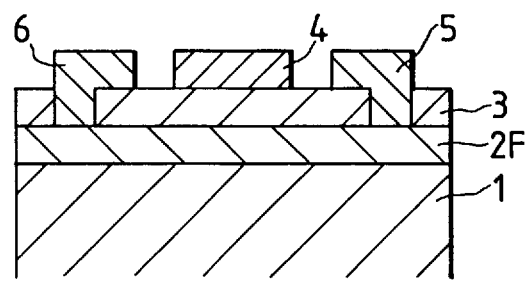
FIG. 14 is a sectional view taken along the line C—C of FIG. 13.

FIGS. 13 and 14 show an eighth example of a field-effect type superconducting device according to this invention. As shown in FIGS. 13 and 14, the superconducting device includes a substrate 1 on which a channel layer 2F extends. The substrate 1 is made of (100)-oriented MgO single crystal. A gate insulating film 3 extends on the channel layer 2F. The gate insulating film 3 has through holes into which a source electrode 5 and a drain electrode 6 extends. The gate insulating film 3 has a thickness of 350 nm. The gate insulating film 3 is made of Bi$_4$Ti$_3$O$_{12}$. Lower ends of the source electrode 5 and the drain electrode 6 contact the channel layer 2F. The source electrode 5 and the drain electrode 6 are made of Pt. A pair of gate electrodes 4 extend on an area of the gate insulating film 3 between the source electrode 5 and the drain electrode 6. The gate electrodes 4 are spaced from each other by a gap of 2 μm. The gate electrodes 4 are made of Pt.

Figure 15:
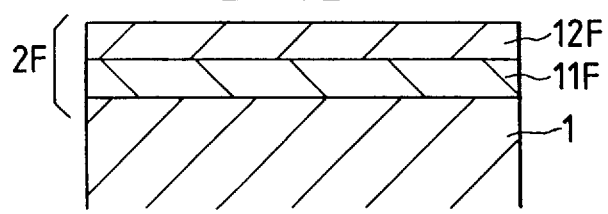
FIG. 15 is a sectional view of a channel layer in FIG. 14.

As shown in FIG. 15, the channel layer 2F has a multilayer (laminated) structure. Specifically, the channel layer 2F has superposition of a lower sub layer 11F and an upper sub layer 12F. The lower sub layer 11F which extends on the substrate 1 is a thin film having a thickness of 30 nm. The thin film 11F is made of oxide mainly including 2201-phase Bi-based oxide expressed as Bi$_2$—Sr$_2$—Cu$_1$—O$_{6\pm\delta}$ where $0 \leq \delta \leq 1$. The upper sub layer 12F which extends on the lower sub layer 11F is a thin film having a thickness of 30 nm. The upper sub layer 12F is made of oxide superconductor mainly including 2223-phase Bi-based oxide superconductor expressed as Bi$_2$—Sr$_2$—Sr$_2$—Cu$_3$—O$_{10\pm\delta}$ where $0 \leq \delta \leq 1$.

Experiments were performed to measure the characteristics of the superconducting device. The conductance between the source electrode 5 and the drain electrode 6 was varied in response to whether or not a same voltage was applied to the gate electrodes 4. In addition, the conductance between the source electrode 5 and the drain electrode 6 was varied in response to whether or not different voltages were applied to the gate electrodes 4 respectively. Under conditions where a constant current remained driven between the source electrode 5 and the drain electrode 6, the voltage between the source electrode 5 and the drain electrode 6 was modulated in accordance with a control voltage at the gate electrodes 4. Thus, it was confirmed that the superconducting device operated as a field-effect type. The available field effect was conspicuous at a temperature of the device in the range of 20 K to 110 K. In addition, the available field effect was enhanced when different voltages were applied to the gate electrodes 4 respectively.

The superconducting device was fabricated as follows. First, a (100)-oriented MgO substrate 1 was prepared. In a vacuum, a thin film 11F having a thickness of 30 nm was deposited on the substrate 1 by RF magnetron sputtering which used an oxide powder target. This oxide powder target was adjusted so that oxide mainly including 2201-phase Bi-based oxide could be deposited. The Bi-based oxide in the thin film 11F was expressed as Bi$_2$—Sr$_2$—Cu$_1$—O$_{6\pm\delta}$ where $0 \leq \delta \leq 1$. During the sputtering to form the thin film 11A, the temperature of the substrate 1 was held at 650° C. Subsequently, in the same vacuum, a thin film 12F having a thickness of 30 nm was deposited on the thin film 11F by RF magnetron sputtering which used an oxide powder target. This oxide powder target was adjusted so that oxide superconductor mainly including 2223-phase Bi-based oxide superconductor could be deposited. The Bi-based oxide superconductor in the thin film 12F was expressed as Bi$_2$—Sr$_2$—Sr$_2$—Cu$_3$—O$_{10\pm\delta}$ where $0 \leq \delta \leq 1$. During the sputtering to form the thin film 12F, the temperature of the substrate 1 was held at 650° C. The thin films 11F and 12F composed a channel layer 2F. Then, in the same vacuum, a Bi$_4$Ti$_3$O$_{12}$ film having a thickness of 350 nm was deposited on the channel layer 2F by RF sputtering. Before the deposition to form the Bi$_4$Ti$_3$O$_{12}$ film was started, the temperature of the substrate 1 was lowered to 550° C. During the deposition of the Bi$_4$Ti$_3$O$_{12}$ film, the temperature of the substrate was held at 550° C.

The channel layer 2F and the Bi$_4$Ti$_3$O$_{12}$ film were made into a channel configuration by a patterning process using ion milling and photolithography. The photolithography employed a negative photoresist. Contact holes for accommodating a source electrode and a drain electrode were formed through the Bi$_4$Ti$_3$O$_{12}$ film by ion milling. Thus, the Bi$_4$Ti$_3$O$_{12}$ film was processed into a gate insulating film 3. Then, a Pt film was deposited on the gate insulating film 3 and exposed areas of the channel layer 2F. The Pt film was made into gate electrodes 4, a source electrode 5, and a drain electrode 6 by a patterning process using ion milling. As a result, the superconducting device was completed.

EXAMPLE 9

A ninth example of a field-effect type superconducting device according to this invention is similar to the seventh example (see FIGS. 11 and 12) except for design changes indicated hereinafter.

Figure 16:
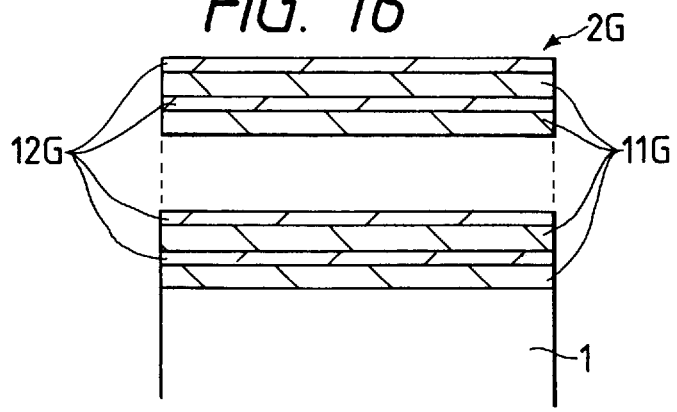
FIG. 16 is a sectional view of a channel layer in a ninth example of a superconducting device according to this invention.

As shown in FIG. 16, a channel layer 2G of the superconducting device has superposition of first-type sub layers 11G and second-type sub layers 12G. The first-type sub layers 11G alternate with the second-type sub layers 12G. The lowermost sub layer extending on a substrate 1 is of the first type. The uppermost sub layer is of the second type. For instance, both the number of the first-type sub layers 11G and the number of the second-type sub layers 12G are equal to four.

Each of the first-type sub layers 11G is a thin film having a thickness of 3 nm. The thin films 11G are made of oxide superconductor mainly including 2212-phase Bi-based oxide superconductor expressed as Bi$_2$—Sr$_2$—Sr$_1$—Cu$_2$—O$_{8\pm\delta}$ where $0 \leq \delta \leq 1$. Each of the second-type sub layers 12G is a thin film having a thickness of 2.4 nm. The thin films 12G are made of oxide mainly including 2201-phase Bi-based oxide expressed as Bi$_2$—Sr$_2$—Cu$_1$—O$_{6\pm\delta}$ where $0 \leq \delta \leq 1$.

A gate insulating film of the superconducting device has a thickness of 400 nm. The gate insulating film is made of Bi$_4$Ti$_3$O$_{12}$.

The superconducting device has a pair of gate electrodes spaced from each other by a gap of 2 μm.

During the deposition of the channel layer 2G, the temperature of the substrate 1 was held at 650° C. In addition, during the deposition of the gate insulating film, the temperature of the substrate 1 was held at 520° C.

Experiments were performed to measure the characteristics of the superconducting device. The conductance between a source electrode and a drain electrode was varied in response to whether or not a same voltage was applied to the gate electrodes. In addition, the conductance between the source electrode and the drain electrode was varied in response to whether or not different voltages were applied to the gate electrodes respectively. The characteristics of the superconducting device, especially the temperature of the superconducting device at which the field effect was conspicuous, depended on the configuration and the thicknesses of the sub layers 11G and 12G in the channel layer 2G. The $Bi_4Ti_3O_{12}$ gate insulating film epitaxially grew on the channel layer 2G, and was essentially free from defects. The gate insulating film exhibited good performances.

EXAMPLE 10

Figure 17:
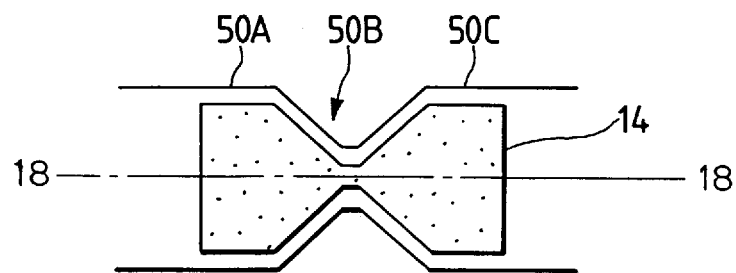
FIG. 17 is a top view of a tenth example of a superconducting device according to this invention.
Figure 18:
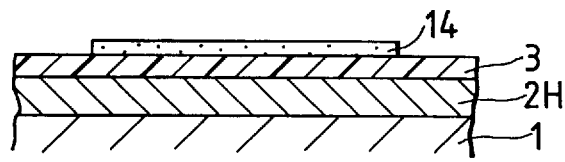
FIG. 18 is a sectional view taken along the line D—D of FIG. 17.

FIGS. 17 and 18 show a tenth example of a superconducting device according to this invention. As shown in FIG. 17, the superconducting device includes wide portions 50A and 50C and a constricted portion (bridge portion) 50B. The constricted portion 50B extends between the wide portions 50A and 50C. The center of the constricted portion 50B is significantly smaller in width than the wide portions 50A and 50C. As shown in FIG. 18, the superconducting device includes a substrate 1 on which a channel layer 2H extends. The substrate 1 is made of (100)-oriented MgO single crystal. A gate insulating film 3 extends on the channel layer 2H. The gate insulating film 3 has a thickness of 200 nm. The gate insulating film 3 is made of $SrTiO_3$ which exhibits ferroelectricity. A control (gate) electrode 14 extends on a given area of the gate insulating film 3. The control electrode 14 is made of Pt.

In accordance with the device configuration of FIG. 17, each of the channel layer 2H, the gate insulating film 3, and the control electrode 14 has wide portions and a constricted portion (bridge portion) extending between the wide portions.

Figure 19:
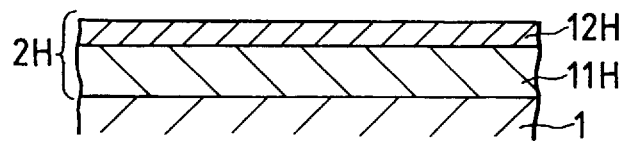
FIG. 19 is a sectional view of a channel layer in FIG. 18.

As shown in FIG. 19, the channel layer 2H has a multilayer (laminated) structure. Specifically, the channel layer 2H has superposition of a lower sub layer 11H and an upper sub layer 12H. The lower sub layer 11H which extends on the substrate 1 is a thin film having a thickness of 30 nm. The thin film 11H is made of Bi-based oxide superconductor mainly including 2212-phase oxide superconductor. The Bi-based oxide superconductor in the thin film 11H is expressed as $Bi_2-Sr_2-Ca_1-Cu_2-O_{8\pm\delta}$ where $0 \leq \delta \leq 1$. The upper sub layer 12H which extends on the lower sub layer 11H is a thin film having a thickness of 10 nm. The thin film 12H is made of oxide mainly including 2212-phase Bi-based oxide expressed as $Bi_2-Sr_2-Nd_1-Cu_2-O_{8\pm\delta}$ where $0 \leq \delta \leq 1$.

Experiments were performed to measure the characteristics of the superconducting device. It was confirmed that the superconducting device operated as a Josephson device. The superconducting critical current in the superconducting device was varied in response to whether or not a voltage was applied to the control electrode 14. Under conditions where a constant current remained driven through the superconducting device, a voltage in the device was modulated in accordance with a control voltage at the control electrode 14. Thus, it was confirmed that the superconducting device operated also as a field-effect type.

The superconducting device was fabricated as follows. First, a (100)-oriented MgO substrate 1 was prepared. In a vacuum, a thin film 11H having a thickness of 30 nm was deposited on the substrate 1 by RF magnetron sputtering which used an oxide powder target. This oxide powder target was adjusted so that Bi-based oxide superconductor mainly including 2212-phase oxide superconductor could be deposited. The Bi-based oxide superconductor in the thin film 11H was expressed as $Bi_2-Sr_2-Ca_1-Cu_2-O_{8\pm\delta}$ where $0 \leq \delta \leq 1$. During the sputtering to form the thin film 11, the temperature of the substrate 1 was held at 650° C. Subsequently, in the same vacuum, a thin film 12H having a thickness of 10 nm was deposited on the thin film 11H by RF magnetron sputtering which used an oxide powder target. This oxide powder target was adjusted so that oxide mainly including 2212-phase Bi-based oxide could be deposited. The Bi-based oxide in the thin film 12H was expressed as $Bi_2-Sr_2-Nd_1-Cu_2-O_{8\pm\delta}$ where $0 \leq \delta \leq 1$. During the sputtering to form the thin film 12H, the temperature of the substrate 1 was held at 650° C. The thin films 11H and 12H composed a channel layer 2H. Then, in the same vacuum, an $SrTiO_3$ film having a thickness of 200 nm was deposited on the channel layer 2H by a suitable process such as an RF sputtering process. During the deposition of the $SrTiO_3$ film, the temperature of the substrate 1 was held at 650° C.

The channel layer 2H and the $SrTiO_3$ film were made into a constricted configuration by a patterning process using ion milling and photolithography. The photolithography employed a negative photoresist. Contact holes for accommodating a current electrode and a voltage electrode (not shown) were formed through the $SrTiO_3$ film by ion milling. Thus, the $SrTiO_3$ film was processed into a gate insulating film 3. Then, a Pt film was deposited on the gate insulating film 3 and exposed areas of the channel layer 2H. The Pt film was made into a gate electrode 14 and other electrodes (not shown) by a patterning process using ion milling and photolithography. The photolithography employed a negative photoresist. As a result, the superconducting device was completed.

EXAMPLE 11

Figure 20:
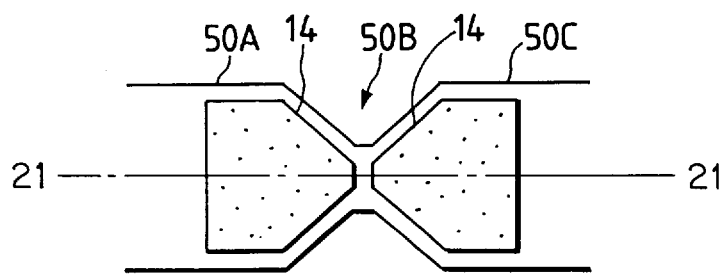
FIG. 20 is a top view of an eleventh example of a superconducting device according to this invention.
Figure 21:
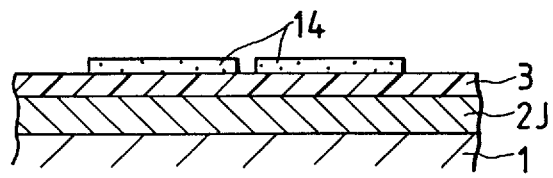
FIG. 21 is a sectional view taken along the line E—E of FIG. 20.

FIGS. 20 and 21 show an eleventh example of a superconducting device according to this invention. As shown in FIG. 20, the superconducting device includes wide portions 50A and 50C and a constricted portion (bridge portion) 50B. The constricted portion 50B extends between the wide portions 50A and 50C. The center of the constricted portion 50B is significantly smaller in width than the wide portions 50A and 50C. As shown in FIG. 21, the superconducting device includes a substrate 1 on which a channel layer 2J extends. The substrate 1 is made of (100)-oriented MgO single crystal. A gate insulating film 3 extends on the channel layer 2J. The gate insulating film 3 has a thickness of 200 nm. The gate insulating film 3 is made of $SiO_2$. A pair of control (gate) electrodes 14 extend on given areas of the gate insulating film 3. The control electrodes 14 extend from the wide portions 50A and 50C into the constricted portion 50B. The control electrodes 14 have tapering potions which extend in the constricted portion 50B and which approximately conform in shape to the halves of the constricted portion 50B. The tapering portions of the control electrodes 14 face each other, and are spaced by a gap of 2 $\mu$m. The control electrodes 14 are made of Pt.

In accordance with the device configuration of FIG. 20, each of the channel layer 2J and the gate insulating film 3 has wide portions and a constricted portion (bridge portion) extending between the wide portions.

Figure 22:
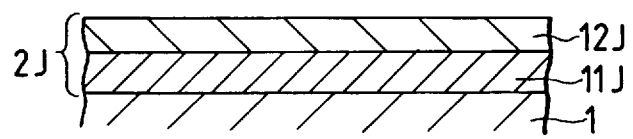
FIG. 22 is a sectional view of a channel layer in FIG. 21.

As shown in FIG. 22, the channel layer 2J has a multilayer (laminated) structure. Specifically, the channel layer 2J has superposition of a lower sub layer 11J and an upper sub layer 12J. The lower sub layer 11J which extends on the substrate 1 is a thin film having a thickness of 30 nm. The thin film 11J is made of oxide mainly including 2201-phase Bi-based oxide expressed as $Bi_2$—$Sr_2$—$Cu_1$—$O_{6\pm\delta}$ where $0 \leq \delta \leq 1$. The upper sub layer 12J which extends on the lower sub layer 11J is a thin film having a thickness of 30 nm. The upper sub layer 12J is made of oxide superconductor mainly including 2223-phase Bi-based oxide superconductor expressed as $Bi_2$—$Sr_2$—$Sr_2$—$Cu_3$—$O_{10\pm\delta}$ where $0 \leq \delta \leq 1$.

Experiments were performed to measure the characteristics of the superconducting device. It was confirmed that the superconducting device operated as a Josephson device. The superconducting critical current in the superconducting device was varied in response to whether or not a same voltage was applied to the control electrodes 14. Under conditions where a constant current remained driven through the superconducting device, a voltage in the device was modulated in accordance with a control voltage at the control electrodes 14. Thus, it was confirmed that the superconducting device operated also as a field-effect type.

The superconducting device was fabricated as follows. First, a (100)-oriented MgO substrate 1 was prepared. In a vacuum, a thin film 11J having a thickness of 30 nm was deposited on the substrate 1 by RF magnetron sputtering which used an oxide powder target. This oxide powder target was adjusted so that oxide mainly including 2201-phase Bi-based oxide could be deposited. The Bi-based oxide in the thin film 11J was expressed as $Bi_2$—$Sr_2$—$Cu_1$—$O_{6\pm\delta}$ where $0 \leq \delta \leq 1$. During the sputtering to form the thin film 11J, the temperature of the substrate 1 was held at 650° C. Subsequently, in the same vacuum, a thin film 12J having a thickness of 30 nm was deposited on the thin film 11J by RF magnetron sputtering which used an oxide powder target. This oxide powder target was adjusted so that oxide superconductor mainly including 2223-phase Bi-based oxide superconductor could be deposited. The Bi-based oxide superconductor in the thin film 12J was expressed as $Bi_2$—$Sr_2$—$Sr_2$—$Cu_3$—$O_{10\pm\delta}$ where $0 \leq \delta \leq 1$. During the sputtering to form the thin film 12J, the temperature of the substrate 1 was held at 650° C. The thin films 11J and 12J composed a channel layer 2J. Then, in the same vacuum, an $SiO_2$ film having a thickness of 200 nm was deposited on the channel layer 2J by RF sputtering. During the deposition of the $SiO_2$ film, the temperature of the substrate 1 was held at 200° C.

The channel layer 2J and the $SiO_2$ film were made into a constricted configuration by a patterning process using ion milling and photolithography. The photolithography employed a negative photoresist. Contact holes for accommodating a current electrode and a voltage electrode (not shown) were formed through the $SiO_2$ film by ion milling. Thus, the $SiO_2$ film was processed into a gate insulating film 3. Then, a Pt film was deposited on the gate insulating film 3 and exposed areas of the channel layer 2J. The Pt film was made into gate electrodes 14 and other electrodes (not shown) by a patterning process using ion milling and photolithography. The photolithography employed a negative photoresist. As a result, the superconducting device was completed.

EXAMPLE 12

Figure 23:
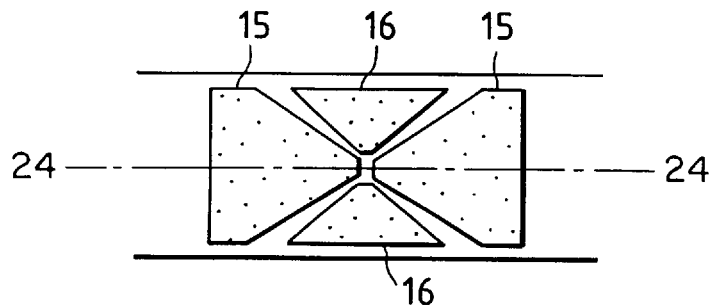
FIG. 23 is a top view of a twelfth example of a superconducting device according to this invention.
Figure 24:
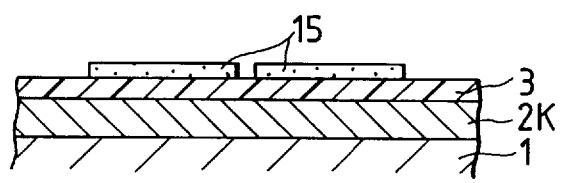
FIG. 24 is a sectional view taken along the line F—F of FIG. 23.

FIGS. 23 and 24 show a twelfth example of a superconducting device according to this invention which is similar to the tenth example (see FIGS. 17 and 18) except for design changes indicated hereinafter. As shown in FIG. 23, the superconducting device a pair of opposing control (gate) electrodes 15 and a pair of opposing control (gate) electrodes 16. The control electrodes 15 have an approximately triangular form. The control electrodes 16 have an approximately triangular form. The control electrodes 15 include tapering portions which face each other and which are spaced from each other by a gap of 2 μm. The control electrodes 16 include tapering portions which face each other and which are spaced from each other by a gap of 2 μm. The first control electrode 15, the first control electrode 16, the second control electrode 15, and the second control electrode 16 are circumferentially arranged by equal angular intervals of 90 degrees.

As shown in FIG. 24, the superconducting device includes a substrate 1 on which a channel layer 2K extends. The substrate 1 is made of (100)-oriented MgO single crystal. A gate insulating film 3 extends on the channel layer 2K. The gate insulating film 3 has a thickness of 150 nm. The gate insulating film 3 is made of Bi—Ti—O. The control electrodes 15 and 16 extend on given areas of the gate insulating film 3 respectively.

Figure 25:
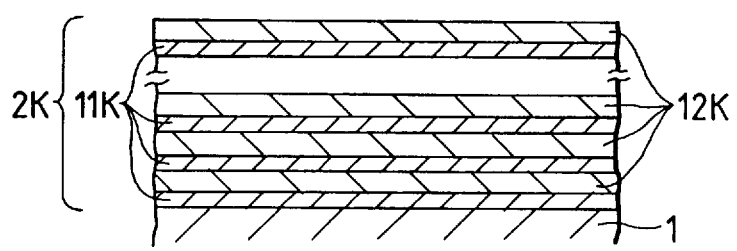
FIG. 25 is a sectional view of a channel layer in FIG. 24.

As shown in FIG. 25, the channel layer 2K has superposition of first-type sub layers 11K and second-type sub layers 12K. The first-type sub layers 11K alternate with the second-type sub layers 12K. The lowermost sub layer extending on a substrate 1 is of the first type. The uppermost sub layer is of the second type. For instance, both the number of the first-type sub layers 11K and the number of the second-type sub layers 12K are equal to four.

Each of the first-type sub layers 11K is a thin film having a thickness of 2.4 nm. The thin films 11K are made of oxide mainly including 2201-phase Bi-based oxide expressed as $Bi_2$—$Sr_2$—$Cu_1$—$O_{6\pm\delta}$ where $0 \leq \delta \leq 1$. Each of the second-type sub layers 12K is a thin film having a thickness of 3 nm. The thin films 12K are made of oxide superconductor mainly including 2212-phase Bi-based oxide superconductor expressed as $Bi_2$—$Sr_2$—$Sr_1$—$Cu_2$—$O_{8\pm\delta}$ where $0 \leq \delta \leq 1$.

During the deposition of the channel layer 2K, the temperature of the substrate 1 was held at 650° C. In addition, during the deposition of the gate insulating film 3, the temperature of the substrate 1 was held at 650° C.

Experiments were performed to measure the characteristics of the superconducting device. The Josephson effect was absent when no voltages were applied to the control electrodes 15 and 16. The Josephson effect was present when a first voltage was applied to the control electrodes 15 and a second voltage different from the first voltage was applied to the control electrodes 16. The characteristics of the superconducting device depended on the configuration and the thicknesses of the sub layers 11K and 12K in the channel layer 2K.

What is claimed is:

1. A field-effect type superconducting device comprising:
   a channel layer including Bi-based oxide compound containing Cu, wherein the channel layer includes a superposition of first and second sub layers which contain first and second Bi-based oxide compounds respectively, each containing Cu, and at least one of the first and second Bi-based oxide compounds in the first and second sub layers includes a Bi-based oxide superconductor containing Cu;
   a source electrode contacting the channel layer;
   a drain electrode contacting the channel layer;
   a gate insulating film made of insulating material and extending on the channel layer; and
   a gate electrode extending on the gate insulating film.

2. The field-effect type superconducting device of claim 1, wherein both the first and second Bi-based oxide compounds in the first and second sub layers are oriented with respect to c-axes, and the gate insulating film includes oxide containing one of Bi and Pb.

3. The field-effect type superconducting device of claim 1, wherein the gate electrode includes sections being separate from each other and forming separate sub gate electrodes.

4. The field-effect type superconducting device of claim 1, wherein the gate insulating film includes ferroelectric material.

5. The field-effect type superconducting device of claim 1, wherein the Bi-based oxide superconductor includes oxide superconductor expressed as $(Bi_{1-y}Pb_y)_2An_2Ln_nCu_{n+1}O(2n+6)\pm\delta$ where An denotes at least one of Sr, Ca and Ba; Ln denotes at least one of Sr, Ca, Ba, Y and lanthanoids; n=0, 1, 2, 3, 4, 5; $0 \leq \delta \leq 1$ and $0 \leq y \leq 0.5$.

6. The field-effect type superconducting device of claim 1, wherein the other of the first and second Bi-based oxide compounds in the first and second sub layers includes oxide expressed as $(Bi_{1-y}Pb_y)_2An_2Ln_nCu_{n+1}O(2n+6)\pm\delta$ where An denotes at least one of Sr, Ca and Ba; Ln denotes at least one of Sr, Ca, Ba, Y and lanthanoids; n=0, 1, 2, 3, 4, 5; $0 \leq \delta \leq 1$; and $0 \leq y \leq 0.5$.

7. The field-effect type superconducting device of claim 1, wherein the gate insulating film includes ferroelectric material expressed as $(Pb_{1-x}La_x)(Z_{1-y}Ti_y)_{1-x/4}O_3$ where $0 \leq x \leq 0.2$ and $0 \leq y \leq 0$.

8. The field-effect type superconducting device of claim 1, wherein the gate insulating film includes ferroelectric material expressed as $Bi_4Ti_3O_{12}$.

9. A field-effect type superconducting device comprising:

an electrically conductive layer;

an insulating layer extending on the electrically conductive layer;

a channel layer extending on the insulating layer and including Bi-based oxide compound containing Cu, wherein the channel layer includes a superposition of first and second sub layers which contain first and second Bi-based oxide compounds respectively, each containing Cu, and at least one of the first and second Bi-based oxide compounds in the first and second sub layers includes a Bi-based oxide superconductor containing Cu;

a source electrode contacting the channel layer;

a drain electrode contacting the channel layer; and a gate electrode contacting the channel layer.

10. The field-effect type superconducting device of claim 9, wherein both the first and second Bi-based oxide compounds in the first and second sub layers are oriented with respect to c-axes, and the insulating layer includes oxide containing one of Bi and Pb.

11. The field-effect type superconducting device of claim 9 wherein the gate electrode includes sections being separate from each other and forming separate sub gate electrodes.

12. The field-effect type superconducting device of claim 9, wherein the insulating layer includes ferroelectric material.

13. The field-effect type superconducting device of claim 9, wherein the Bi-based oxide superconductor includes oxide superconductor expressed as $(Bi_{1-y}Pb_y)_2An_2Ln_nCu_{n+1}O(2n+6)\pm\delta$ where An denotes at least one of Sr, Ca, and Ba; Ln denotes at least one of Sr, Ca, Ba, Y, and lanthanoids; n=0, 1, 2, 3, 4, 5; $0 \leq \delta \leq 1$; and $0 \leq y \leq 0.5$.

14. The field-effect type superconducting device of claim 9, wherein the other of the first and second Bi-based oxide compounds in the first and second sub layers includes oxide expressed as $(Bi_{1-y}Pb_y)_2An_2Ln_nCu_{n+1}O(2n+6)\pm\delta$ where An denotes at least one of Sr, Ca and Ba; Ln denotes at least one of Sr, Ca, Ba, Y and lanthanoids; n=0, 1, 2, 3, 4, 5; $0 \leq \delta \leq 1$; and $0 \leq y \leq 0.5$.

15. The field-effect type superconducting device of claim 9, wherein the insulating layer includes ferroelectric material expressed as $(Pb_{1-x}La_x)(Zr_{1-y}Ti_y)_{1-x/4}O_3$ where $0 \leq x \leq 0.2$ and $0 \leq y \leq 1.0$.

16. The field-effect type superconducting device of claim 9, wherein the insulating layer includes ferroelectric material expressed as $Bi_4Ti_3O_{12}$.

17. A superconducting device comprising:

a channel layer including Bi-based oxide compound containing Cu, wherein the channel layer includes a superposition of first and second sub layers which contain first and second Bi-based oxide compounds respectively, each containing Cu, and at least one of the first and second Bi-based oxide compounds in the first and second sub layers includes a Bi-based oxide superconductor containing Cu;

an electrode insulating film made of insulating material and extending on the channel layer; and a control electrode extending on the electrode insulating film and having a constricted portion.

18. The superconducting device of claim 17, wherein both the first and second Bi-based oxide compounds in the first and second sub layers are oriented with respect to c-axes, and the electrode insulating film includes oxide containing one of Bi and Pb.

19. The superconducting device of claim 17, wherein the control electrode includes sections being separate from each other and forming separate sub gate electrodes.

20. The superconducting device of claim 17, wherein the electrode insulating film includes ferroelectric material.

21. The superconducting device of claim 17, wherein the Bi-based oxide superconductor includes oxide superconductor expressed as $(Bi_{1-y}Pb_y)_2An_2Ln_nCu_{n+1}O(2n+6)\pm\delta$ where An denotes at least one of Sr, Ca and Ba; Ln denotes at least one of Sr, Ca, Ba, Y and lanthanoids; n=0, 1, 2, 3, 4, 5; $0 \leq \delta \leq 1$; and $0 \leq y \leq 0.5$.

22. The field-effect type superconducting device of claim 17, wherein the other of the first and second Bi-based oxide compounds in the first and second sub layers includes oxide expressed as $(Bi_{1-y}Pb_y)_2An_2Ln_nCu_{n+1}(2n+6)\pm\delta$ where An denotes at least one of Sr, Ca and Ba; Ln denotes at least one of Sr, Ca, Ba, Y and lanthanoids; n=0, 1, 2, 3, 4, 5; $0 \leq \delta \leq 1$; and $0 \leq y \leq 0.5$.

23. The superconducting device of claim 17, wherein the electrode insulating film includes ferroelectric material expressed as $(Pb_{1-x}La_x)(Zr_{1-y}Ti_y)_{1-x/4}O_3$ where $0 \leq x \leq 0.2$ and $0 \leq y 1.0$.

24. The superconducting device of claim 17, wherein the electrode insulating film includes ferroelectric material expressed as $Bi_4Ti_3O_{12}$.

25. A superconducting device comprising:

a channel layer including Bi-based oxide compound containing Cu, wherein the channel layer includes a superposition of first and second sub layers which contain first and second Bi-based oxide compounds respectively, each containing Cu, and at least one of the first and second Bi-based oxide compounds in the first and second sub layers includes a Bi-based oxide superconductor containing Cu;

an electrode insulating film made of insulating material and extending on the channel layer; and a pair of control electrodes extending on the electrode insulating film and having respective tapered portions which face each other.

26. The superconducting device of claim 25, wherein both the first and second Bi-based oxide compounds in the first and second sub layers are oriented with respect to c-axes, and the electrode insulating film includes oxide containing one of Bi and Pb.

27. The superconducting device of claim 25, wherein each of the control electrodes includes sections being separate from each other and forming separate sub gate electrodes.

28. The superconducting device of claim 25, wherein the electrode insulating film includes ferroelectric material.

29. The superconducting device of claim 25, wherein the Bi-based oxide superconductor includes oxide superconductor expressed as $(Bi_{1-y}Pb_y)_2An_2Ln_nCu_{n+1}(2n+6)\pm\delta$ where An denotes at least one of Sr, Ca and Ba; Ln denotes at least one of Sr, Ca, Ba, Y and oids; n=0, 1, 2, 3, 4, 5; $0\leq\delta\leq1$; and $0\leq y\leq0.5$.

30. The field-effect type superconducting device of claim 25, wherein the other of the first and second Bi-based oxide compounds in the first and second sub layers includes oxide expressed as $(Bi_{1-y}Pb_y)_2An_2Ln_nCu_{n+1}O(2n+6)\pm\delta$ where An denotes at least one of Sr, Ca and Ba; Ln denotes at least one of Sr, Ca, Ba, Y and oids; n=0, 1, 2, 3, 4, 5; $0\leq\delta\leq1$; and $0\leq y\leq0.5$.

31. The superconducting device of claim 25, wherein the electrode insulating film includes ferroelectric material expressed as $(Pb_{1-x}La_x)(Zr_{1-y}Ti_y)_{1-x/4}O_3$ where $0\leq x\leq0.2$ and $0\leq y\leq1.0$.

32. The superconducting device of claim 25, wherein the electrode insulating film includes ferroelectric material expressed as $Bi_3Ti_4O_{12}$.

* * * * *